United States Patent [19]

Abbagnaro et al.

[11] Patent Number: 5,357,179

[45] Date of Patent: Oct. 18, 1994

[54] HANDHELD LOW VOLTAGE MACHINING TOOL

[75] Inventors: Louis A. Abbagnaro; William J. Siegel, both of Silver Spring; Charles H. McDavid, Jr., Baltimore; Charles M. Cardno, Ellicott City, all of Md.; James L. Mason, Jacobus, Pa.; Anthony Q. Tang, McLean, Va.; Robert S. Quasney, Sr., Pasadena; Robert G. Brown, Annapolis, both of Md.

[73] Assignee: Pace, Incorporated, Laurel, Md.

[21] Appl. No.: 901,228

[22] Filed: Jun. 19, 1992

[51] Int. Cl.⁵ .................. B23B 45/02; H02P 3/12
[52] U.S. Cl. ..................... 318/17; 318/375; 388/937
[58] Field of Search .................. 318/17, 375, 379; 388/937; 200/332.2; 310/47, 50, 53; 81/467, 469; 173/2; 408/5, 7, 8, 9

[56] References Cited

U.S. PATENT DOCUMENTS

| | | |
|---|---|---|
| 3,711,997 | 1/1973 | Kushigian . |
| 3,824,891 | 7/1974 | Carroll . |
| 4,292,571 | 9/1981 | Cuneo . |
| 4,487,270 | 12/1984 | Huber . |
| 4,491,295 | 1/1985 | Thornton et al. . |
| 4,650,375 | 3/1987 | Millsap . |
| 4,745,557 | 5/1988 | Pekar et al. . |
| 4,790,065 | 12/1988 | Cooper, Jr. et al. . |

Primary Examiner—Bentsu Ro
Attorney, Agent, or Firm—Sixbey, Friedman, Leedom & Ferguson

[57] ABSTRACT

A handheld low voltage machining tool with which any one or more of drilling, milling, and abrading operations can be safely performed even on densely populated, multilayer, circuit boards. Provisions are made for preventing electrical overstress by isolating the tip of the machining tool from the drive motor as well as for preventing abrupt starting of the tool which can cause jerking, jumping or skipping of the tool off of the target. Still further, dynamic braking of the tool bit is achieved, both upon release of an operator actuated control switch and due to a selected conductive layer being reached. For the latter effect, a probe is provided by which a low voltage can be delivered to a component or conductor on the board, and circuitry detects grounding of this voltage by contact with the grounded bit of the machining tool.

20 Claims, 8 Drawing Sheets

HANDHELD LOW VOLTAGE MACHINING TOOL

BACKGROUND OF THE INVENTION

1. Field of the Invention

The present invention relates to handheld tools for machining of workpieces. More specifically, the present invention is directed to such handheld tools as used to perform any one or more of drilling, milling, and abrading operations, especially for precise circuitry and substrate repair, as well as for modification and conformal coating removal, with respect to printed circuit boards.

2. Description of Related Art

During printed circuit board assembly or repair, occasions arise which require extra holes to be drilled, coatings or solder masks to be ground away, conductive traces to be severed, buried conductors to be located or excavated, card edge contacts to be burnished or polished, or other machining operations to be performed. In the past, a technician would use a tool such as a simple electric hand drill. Examples of hand drills with bits for performing such circuit board machining operations are the MAXI DRILL and MINI DRILL by Sterling (a Wahl Clipper corporation), the Weller model 601 and the Dremel model 232 tools. These types of tools may have been acceptable with older technology printed circuit boards, but they pose numerous problems for newer, densely populated, multilayer boards.

For example, the electronics industry is now very conscious of touching a tool of unknown electric potential to a circuit board populated with expensive, sensitive semiconductors since electrical overstress (EOS) damage can result, such as from transient voltages of the tool's electric motor being coupled to the tip and transferred to the circuit board. Additionally, tightly packed assemblies require precision since it is difficult to target a point of interest without touching adjacent components and conductors. Existing products lack adequate speed control to prevent abrupt starting of the tool which can cause jerking, jumping or skipping of the tool off of the target and fast starting speeds also lead to "wandering" of the tool. The operator often tenses up, squeezing hard to limit instability, and this leads to operator fatigue within a short time. Abrupt starting can also cause torques to be applied which are, themselves, damaging to sensitive/delicate workpieces. Not only is fast starting a problem, but so is the inability of such known tools to obtain a virtually immediate stopping of the tool bit when the operator releases the control switch. That is, when the control switch is released, the tool coasts to a stop and while coasting, as the operator relaxes or as the tool bit is extracted from the work, e.g., a drilled hole may become out-of-round, or a conductor (which on some boards can be quite thin) can be damaged, especially when drilling down to interior layers of a multilayer board (where it is also possible for a conductor to be severed if the operator inadvertently fails to release the control switch in time).

Outside of the circuit board environment, handheld drills are known which have a torque limiting feature (see, U.S. Pat. No. 4,487,270), as are handheld drills which have a rotational speed control (see, U.S. Pat. No. 4,292,571). However, these controls are for protection of the tool not the workpiece.

Additionally, a handheld drill is known (see, U.S. Pat. No. 4,650,375) which has a dynamic braking system for stopping a drill bit when it contacts an electrically conductive material. More specifically, to prevent electrocution of a person accidentally drilling into an electric power line, as well as interruption of the power supply should the power line be severed, a comparator/detector control is connected to the drill bit and motor circuit. With this control, upon detecting ground or power, an operational amplifier becomes unbalanced, resulting in a detection output signal being produced which, in turn, leads to the circuit to the motor windings being momentarily opened, after which the motor windings are briefly reversed and then disabled. However, the control of this drill brake requires high excitation voltages of the type found in 120 volt power lines, and cannot be made sensitive enough to respond to voltages in the millivolt range (which are required for safe use with printed circuits and sensitive electrical components found on circuit boards) without the control circuit being triggered by leakage voltages from the drill motor circuit.

Of course, drill presses with computer-controlled control systems are known (see, U.S. Pat. No. 4,745,557) which enables multi-ply workpieces of different thicknesses and hardnesses to be worked upon. In the particular control system of U.S. Pat. No. 4,745,557, the translational and rotational velocities of the drill bit can be continuously controlled using a feedback system which receives information from an optical beam sensor. However, such a system is not practical for a handheld tool, and even if it were, the various problems associated with printed circuit board machining operations, mentioned above, would still not be addressed.

SUMMARY OF THE INVENTION

In view of the foregoing, it is a general object of the present invention to provide a handheld low voltage machining tool with which any one or more of drilling, milling, and abrading operations can be safely performed even on densely populated, multilayer, circuit boards.

It is a more specific object of the present invention to achieve the preceding object by preventing electrical overstress by isolating the tip of the machining tool from the drive motor.

Another object of the invention is to provide a handheld machining tool having speed control which will prevent abrupt starting of the tool which can cause jerking, jumping or skipping of the tool off of the target.

A further object of the present invention is to provide a handheld machining tool having an arrangement for achieving dynamic braking of the tool, both upon release of an operator actuated control switch and due to a selected conductive layer being reached.

These and other objects of the invention are achieved in accordance with a preferred embodiment of the invention. More specifically, through a specifically designed combination of a drive shaft extension that is galvanically isolated from the motor shaft, a particular arrangement of adjacent conductors in the handpiece cable, and inclusion of a bifilar wound toroidal choke behind the motor terminals, the potential for producing electrical overstress that can damage sensitive components is reduced or eliminated. Furthermore, by virtue of this accomplishment, the tool control can have an associated brake probe through which a current-limited millivolt voltage can be applied to a conductive layer, and this voltage is grounded when the tip of the tool reaches the selected layer. As a result, the tool can be used as a test probe by signalling ground continuity to a specific track or layer of a printed circuit board. Additionally, when drilling into a multilayer board, when the tool bit reaches a conductive track or layer, the brake probe, will immediately detect this occurrence and activate a dynamic braking of the drive motor to produce a virtually immediate stopping to the machining tool bit. A similar dynamic braking is produced whenever the actuating switch is released by the operator. Still further, to prevent abrupt starting of the tool, which can cause jerking, jumping or skipping of the tool off of the target, a smooth start control is provided which uses an R/C circuit to regulate powering up of the motor.

These and other objects features and advantages of the present invention will become apparent from the following detailed description of the preferred embodiment when viewed in conjunction with the accompanying drawings.

DETAILED DESCRIPTION OF THE PREFERRED EMBODIMENT

With reference to FIGS. 1–4, it can be seen that a machining tool 1 in accordance with the illustrated preferred embodiment of the invention has two main components, a handpiece 5 and a control unit 10. The handpiece 5 has a chuck or collet 7 by which a wide variety of tool bits may be attached to the handpiece, depending on the type of machining operation to be performed; for example, conventional types of bits for drilling, milling, abrading, etc. may be provided. A power and control cable 9 is used to couple the handpiece 5 to the output jack 11 of control unit 10.

Figure 4:
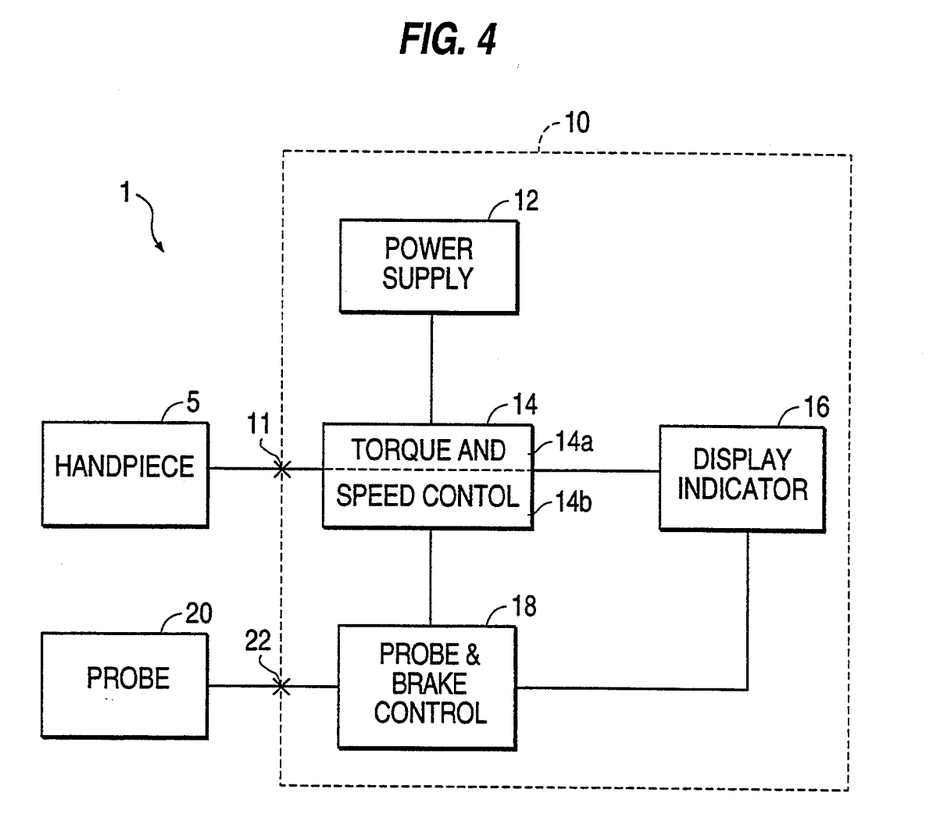
FIG. 4 is a block diagram depicting the machining tool according to the present invention.

As can be seen from the block diagram of FIG. 4, the control unit 10 of the machining tool 1 contains a power supply 12, a torque and speed control 14, a display indicator 16, and a probe and brake control 18. A probe 20, which is used for purposes described in greater detail below in connection with FIGS. 7 & 8, externally connects to control unit 10. As seen in FIG. 4, torque and speed control 14 is connected to power supply 12, display indicator 16, probe and brake control 18, and handpiece 5. The probe and brake control 18 is connected to the display indicator 16 and probe 20.

For the power supply 12, any suitable DC power supply could be used. However, in the preferred embodiment, a standard 3-prong power cord is used to connect the control unit to a building outlet supplying standard 115 V, 60 Hz (U.S.) or 230 V, 50–60 Hz (foreign) A/C electrical power and a transformer and rectifier bridge is used to convert this power supply to, e.g., 5–28 volts DC at 2 amperes or less.

Figure 5:
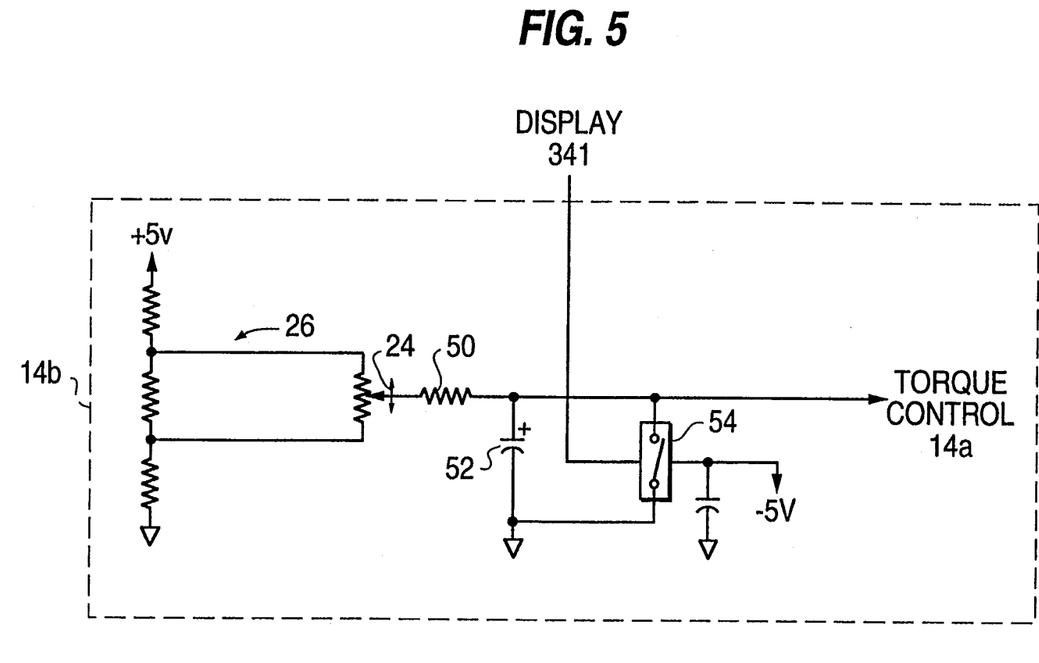
FIG. 5 is a circuit diagram of a speed control aspect of the present invention.

In operation, power supply 12 provides power directly to the torque and speed control 14, and indirectly, from the torque and speed control 14 to the display indicator 16, probe and brake control 18 and handpiece 5. The torque and speed control 14 provides power sufficient to operate the handpiece 5 at a preset speed set by control knob 24, e.g., in a range of from 2,500 to 10,000 rpm, which acts on a potentiometer 26 (FIG. 5). However, the torque and speed control 14 also has two significant other functions. That is, as a torque and speed control 14, it provides a closed-loop operation by which whatever speed is set by the operator is tightly held under varying load conditions within the limits of the drive motor, continuously monitoring rotation of the motor M in handpiece 5, and if it deviates from the preset speed, adjusts the power to the motor M to bring it back to the preset speed. As will be described below in greater detail relative to FIG. 6, for cost efficiency, a separate tachometer or pickup is not used to measure motor speed, and instead, the generator effect, inherent in any DC permanent magnet motor, is used to electronically feed back motor speed to the torque control 14a. Torque control 14a also monitors motor current draw as a measure of torque, and if the current exceeds a predetermined fixed setting, power is not increased any further and a signal is generated to alert the operator when this occurs.

The second function of torque and speed control 14 is that, as a speed controller 14b, it insures that an abrupt increase in speed is not produced when the handpiece is actuated, and in this way, prevents the bit from jerking, skipping or jumping off target and damaging adjacent components and conductors. That is, by gently ramping up speed in the first second of operation, e.g, a drill bit can be placed on a point while still, and will not skip or wander once the motor M is switched on. As can be seen in FIG. 5., a resistor 50 and a capacitor 52 place an R/C time constraint on the set speed so that the motor slowly comes up to speed. While a great deal of freedom is available in the selection of resistance and capacitance values which will produce a suitable smooth speeding-up effect, it has been found that one advantageous combination of values is to use a resistor 50 of 120KΩ with a capacitor 52 of 2.2 microfarads. To insure that this progressive speeding-up effect is achieved even if the handpiece is switched back on shortly after being switched off, a switch 54 is closed whenever the motor M of the handpiece 5 is turned off. Closing of switch 54 grounds and rapidly discharges the capacitor 52.

Figure 6:
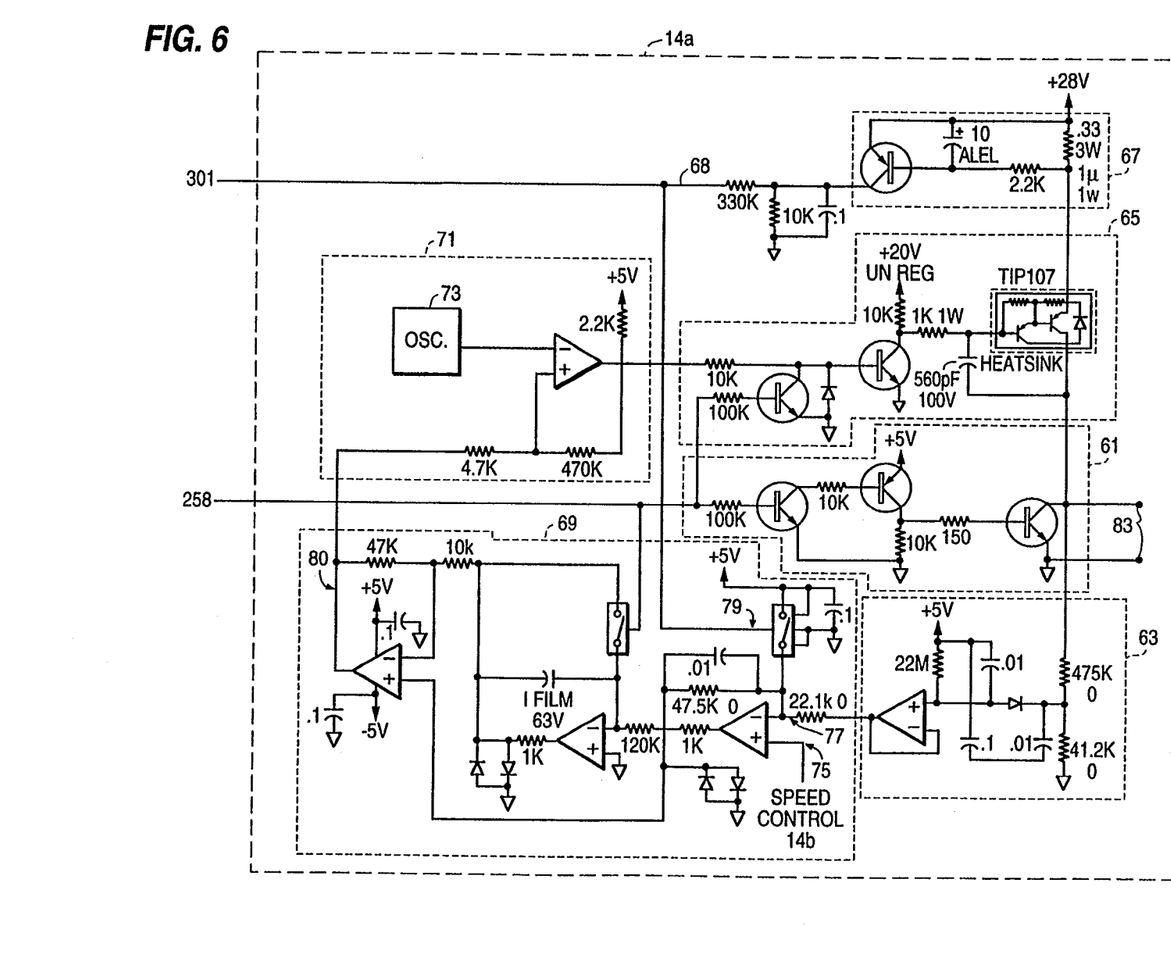
FIG. 6 is a circuit diagram of a torque control aspect of the present invention.

The torque control 14a portion of the torque and speed control 14 is shown in more detail in FIG. 6 and acts together with the speed control 14b to monitor the speed and torque of the handpiece 5 and to make adjustments to the torque and speed of the handpiece 5 when required. The circuitry of the torque control 14 is composed of motor braking circuitry 61; speed measurement circuitry 63; motor drive circuitry 65; torque limiting circuitry 67; throttle circuitry 69; and pulse circuitry 71.

Speed measurement circuitry 63 is used to monitor the speed of handpiece 5, and it provides a correction signal to throttle circuitry 69 when required to increase or decrease the speed of the tool to maintain the set speed despite variations in load. Speed measurement circuitry 63 operates by monitoring the back EMF generated from the DC motor M while the motor is "coasting" between driving pulses. This provides an improved cost efficiency since a separate tachometer or pickup is not required to measure motor speed.

Pulse circuitry 71 is used to generate a pulse train to control the motor drive circuitry 65. Pulse circuitry 71 uses oscillator 73 and the output from throttle circuitry 69 to generate the pulse train. Oscillator 73 generates an approximate sawtooth wave at a frequency of approximately 300 hertz. This pulse train from pulse circuitry 71 is used by motor drive circuitry 65. Motor drive circuitry 65 creates a series of pulses suitable to drive the motor M of handpiece 5. Motor drive circuitry 65 also is connected to the probe and brake circuitry for stopping drive to the machining tool motor when the tool is to be stopped.

Torque limiting circuitry 67 monitors the torque on the motor M of handpiece 5 as reflected by motor current draw, and provides an overtorque signal 68 when the motor current draw exceeds a preset value equivalent to, e.g., approximately 2 inch-ounces of torque, in order to prevent damage to the motor M. The overtorque signal is used by the display indicator 16 and the throttle circuitry 69, as described below.

Throttle circuitry 69 is used to generate a throttle signal that controls the speed of handpiece 5. The throttle circuitry receives the output of speed control 14b at 75, the output from speed measurement circuitry 63 at 77, and the over-torque signal 68 from torque limiting circuitry 67 at 79 to determine the level of throttle output 80. The throttle circuitry compares the signal from the speed control 14b received at 75 with the output from speed measurement circuitry 63 received at 77, and adjusts the throttle level to bring the measured speed into conformance with the set speed. However, if an over-torque condition is detected by the torque limiting circuitry, the over-torque signal 68 received at 79 will override the output from speed measurement circuitry 63. The throttle circuitry shown uses a proportional-integral-derivative (PID) controller circuit to determine the level of throttle output 80.

Motor braking circuitry 61 provides a means for braking the machining tool motor when a braking condition exists. A Brake signal from the probe and brake control 18 is input to motor braking circuitry 61. When a braking condition exists, motor braking circuitry 61 provides a short circuit between terminals 83 of the motor M to rapidly stop the motor (tests have indicated that this control can bring the tool from 10,000 rpm to a stop within 6 revolutions). Although not shown in FIG. 6, other means for braking the motor, such as supplying a reverse voltage to facilitate braking, may be employed in place of the motor braking circuitry 61.

Figure 1:
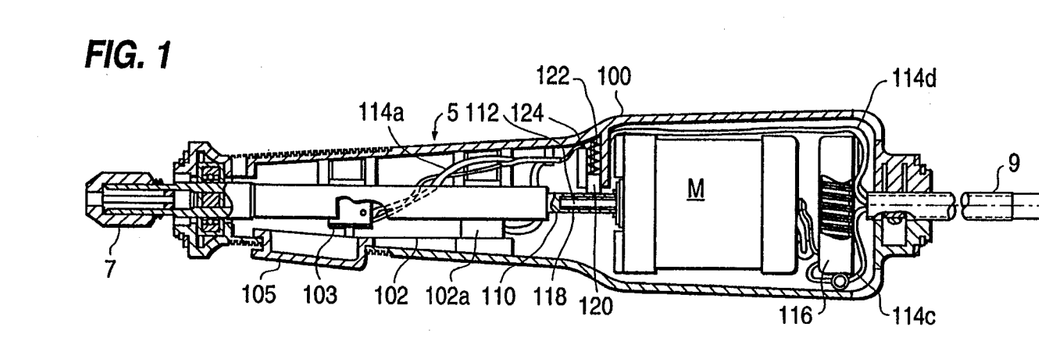
FIG. 1 is a vertical, partial cross-sectional view of a handpiece forming one major component of a preferred embodiment machining tool according to the present invention.
Figure 2:
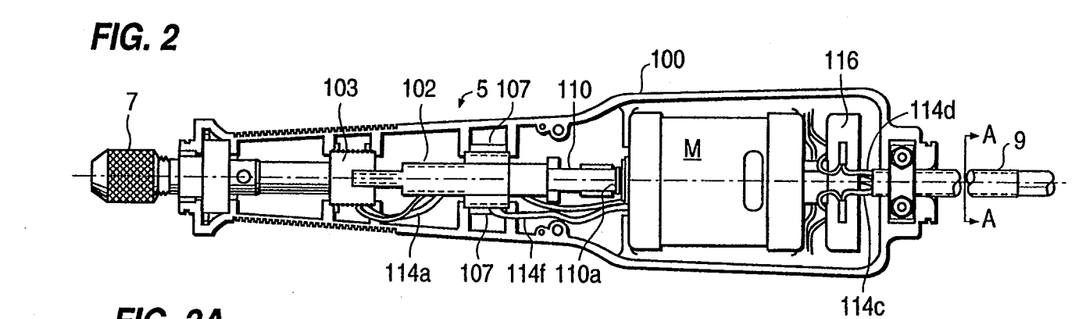
FIG. 2 is a horizontal, partial cross-sectional view of the handpiece of FIG. 1.

FIGS. 1 & 2 show a preferred form of the handpiece 5. The handpiece housing 100 is made of an electrostatic discharge (conductive) plastic (such plastics are commercially available and typically have metal graphite, or other electrically conductive particles distributed throughout the plastic material). For this reason, one of the actuating switch contacts 102, 103 must be electrically insulated relative to housing 100. In this case, an insulating tape of, for example, KAPTON (1 mil polymide film with a cured silicon adhesive layer) tape is applied over the surface of the leaf spring type switch contact 102. Switch contact 102 is engaged by actuating switch 105, and supporting legs 102a of the switch contact 102 are received in insulating sleeves 107 which are made, for example, of nylon.

As mentioned above, a specifically designed combination of a drive shaft extension 110 that is galvanically isolated from the drive shaft 112 of the motor M, a particular arrangement of adjacent conductors 114a-f (FIG. 2A) in the handpiece cable 9, and the inclusion of a bifilar wound toroidal filter choke 116 behind the motor terminals is used to reduce or eliminate the potential for producing electrical overstress that can damage sensitive components on a printed circuit board being worked upon with tool 1. That is, without any special measures being taken, a 12 V/20 V DC motor will be subject to high frequency (HF) transient voltage spikes due to commutator brush arcing of, e.g., 4,000 mv and low frequency (LF) spikes caused by propagation of the motor control signal of, e.g., 400 mv, and thus, AC leakage at the tool bit of, e.g., 40 mv, can result. On the other hand, this combination of features has been found to enable the HF spikes to be reduced to 1400 mv, the LF spikes to 60 mv and the AC leakage to 2.5 mv rmf.

To galvanically isolate drive shaft extension 110 from the drive shaft 112 of motor M, the drive shaft extension 110 is connected to the drive shaft 112 via an interposed, press fit thermoplastic insulator sleeve 118 of DELRIN acetal resin. The front end of drive shaft extension 110 is rotatably supported in a shielded beating 119, e.g., a steel beating, the outer race of which is contained within a nonconductive elastomeric jacket. Additionally, the drive shaft extension 110 is grounded in a particularly advantageous manner that has been found to minimize shaft wear and particle production (a problem associated with known carbon rotary shaft grounding brushes) and which is particularly important in a case, such as this, where there is a low current that is insufficient to produce an arc-cleaning effect. In particular, the drive shaft extension 110 is made of brass and a grounding brush block 120, made of a 95% Cu-5% C material (of a type known for use for excitation of a motor commutator), is held in contact with the drive shaft extension 110 by a spring 122 having a spring rate of, e.g., 1.74 lb/in. A shunt wire 124 has one end conductively secured to the brush block 120 and the other end conductively connected to switch contact 103, which is not electrically insulated from the static dissipative housing 100. With such an arrangement, less than a 2 ohm impedance to ground at the tool bit has been found to be achievable. The shaft 110 has a flange 110a at its end facing motor M. Flange 110a provides a mechanical barrier preventing motor bearing oil from migrating to the brush block area where it could interfere with grounding.

The filter choke 116 has a bifilar, toroidal core having a nominal inductance of 400 $\mu$H at 1 KHz, and effectively reduces, particularly, HF transients. The filter choke, as apparent from FIGS. 1 & 2, is connected between the conductor wires 114c, 114d of the handpiece cable 9 and the input terminals of the drive motor M.

Figure 2A:
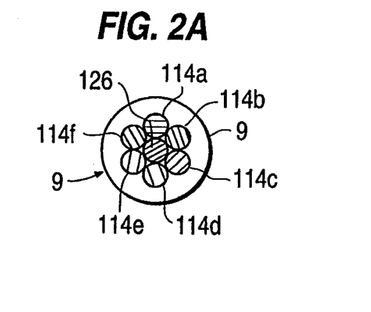
FIG. 2A is an enlarged cross-sectional view of the handpiece power cable taken along line A—A in FIG. 2.
Figure 3:
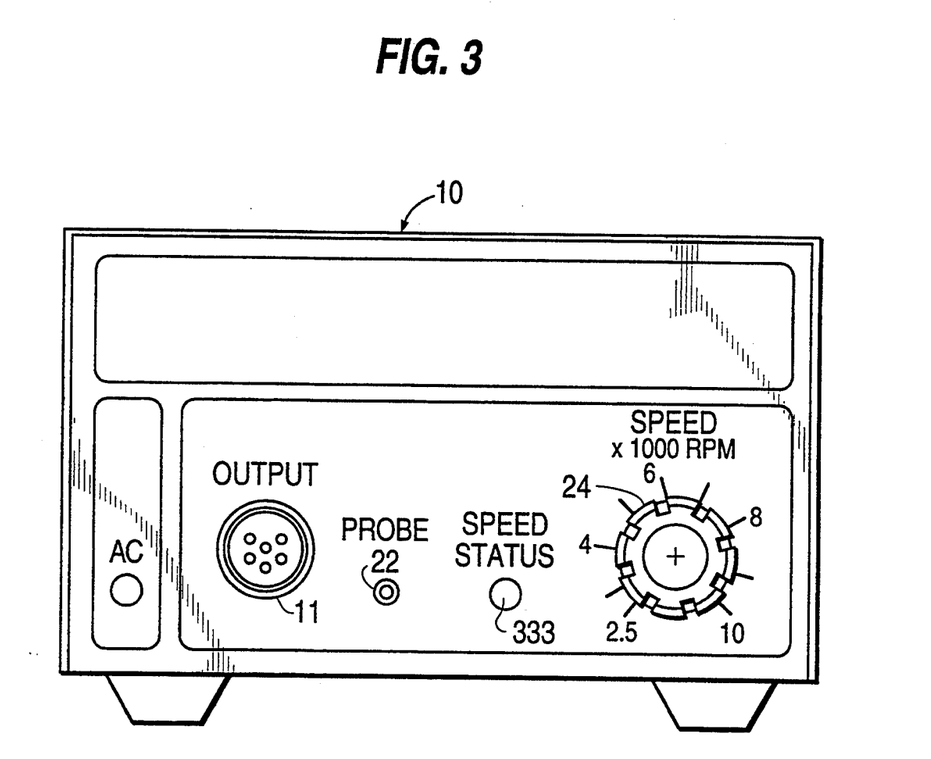
FIG. 3 is a front elevational view of a control unit forming a second major component of the preferred embodiment machining tool according to the present invention.

As can be seen with reference to FIG. 2A, the handpiece power cable 9 has six conductor wires 114a–f arranged around a ground wire 126, and the specific sequence has been found to contribute significantly to attainment of a reduction in transient voltages. In particular, a sequence must be maintained by which the ground wire is shielded from the wires carrying the motor drive signals by unused wires. For example, wire 114a runs to the ground brush block 120 via switch contact 103, wires 114b and 114e are not used and optionally can be connected together at both ends to form a shield loop, wires 114c and 114d are connected to carry the motor signal to filter choke 116, and wire 114f is connected to switch contact 102. In this way, the ground wire 114a is shielded from the noise in the drive signal carrying wires 114a and 114d by the presence of the interposed unused wires 114b and 114e. Also, it should be realized that the position of wire 114f, as shown, is noncritical and could be switched, e.g., with that of wire 114a or 114e so long as wire 114a remains maximally spaced from wires 114c and 114d with wires 114b and 114f therebetween.

Figure 7:
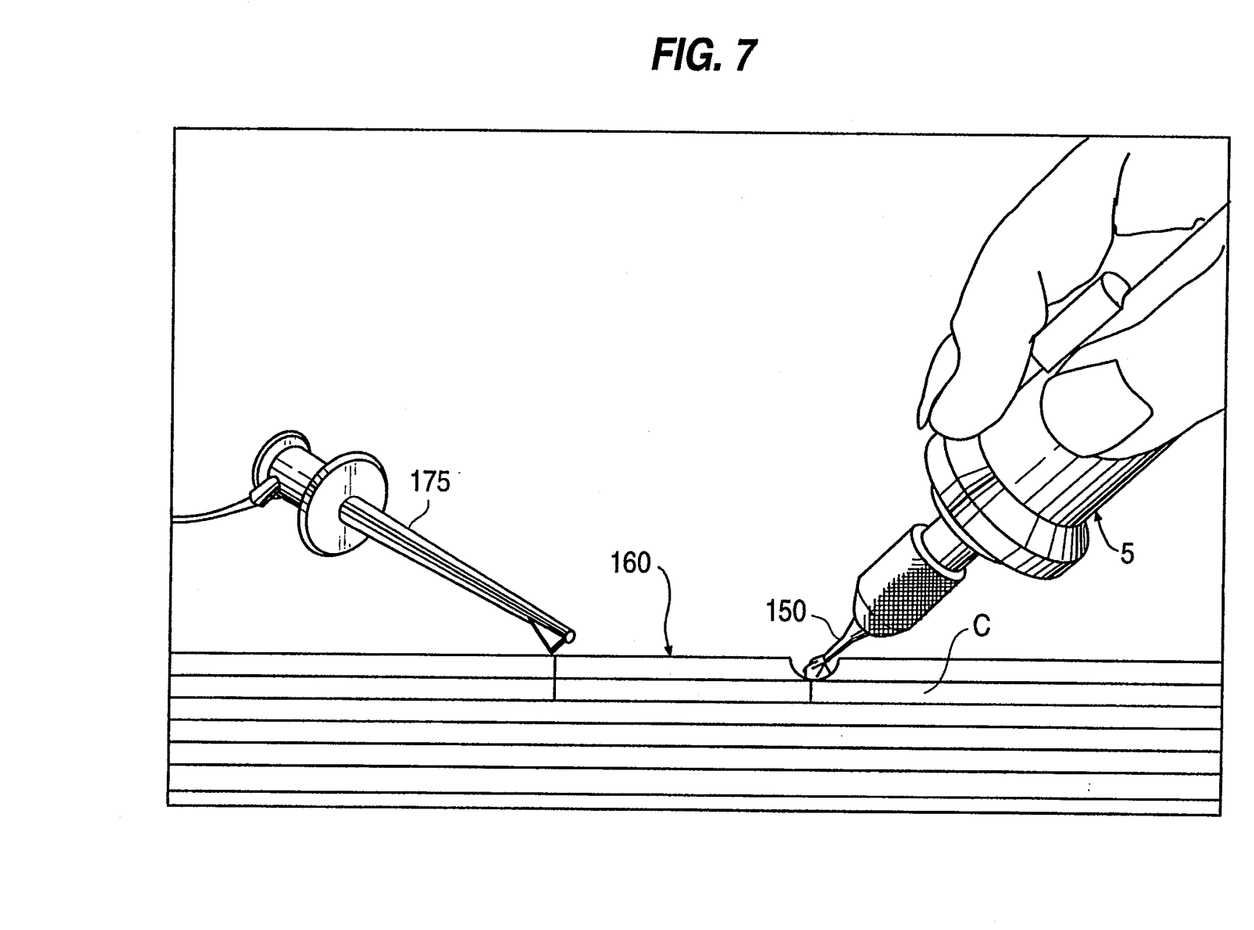
FIG. 7 is a diagrammatic depiction of use of the machining tool for machining to a selected layer of a multilayer circuit board.

Turning now to FIG. 7, an especially advantageous feature of the present invention for working on multilayer circuit boards will now be described. That is, FIG. 7 depicts an operator using the handpiece 5, with a drill bit 150 to excavate a circuit board 160 to reveal an inner conductor C. With the machining tool of the present invention, this operation can be performed with ease and precision without fear of accidentally destroying conductor layer C due to an automatic braking function that is made possible due to the above-described facts that the shaft extension 110 and the tool bit 150 secured in the collet 7 on its end together are grounded and the low level of transient voltage leakage from the drive motor M. Alternatively, the tool can be used with probe 175 as circuit tester by signalling ground continuity to a specific track or layer of a printed circuit board. In particular, one end of probe 175 is connected to the control unit 10 via probe jack 22 (FIG. 3) and the other end is connected to a trace or component on the board that is connected to the internal conductor to be excavated. The probe 175 is supplied with a current-limited low level voltage (e.g., 200 mv) by probe and brake control 18 of the control unit 10, and when the bit 150 reaches the conductor C, this voltage is grounded. When the probe and brake control 18 detects the grounding of the supplied voltage, the tool bit is dynamically braked in the manner now to be described.

Figure 8:
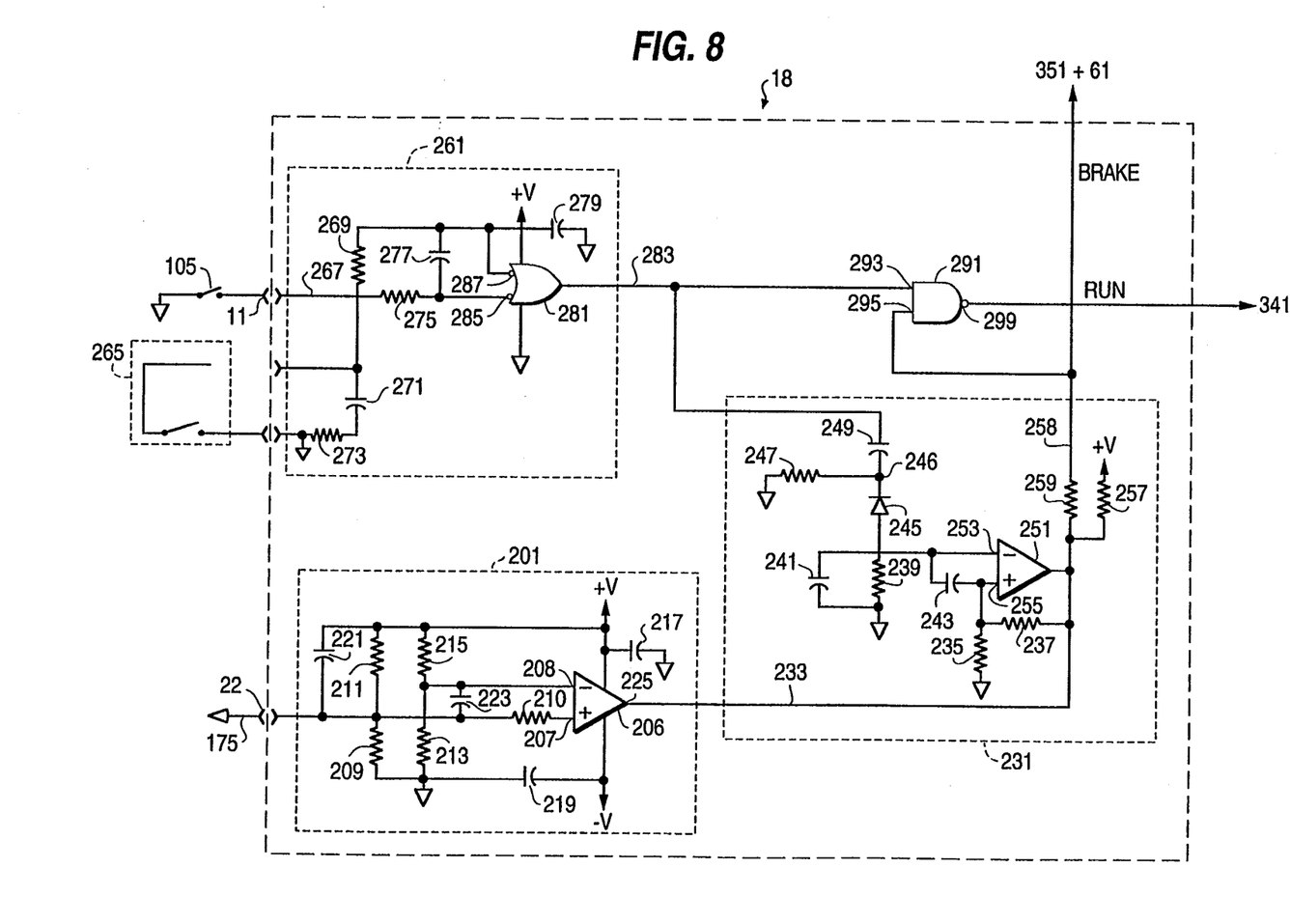
FIG. 8 is a circuit diagram of a probe and brake control to automatically stop machining when the selected layer is reached when performing a machining operation of the type depicted in FIG. 7.

FIG. 8 shows the probe and brake control 18 in more detail. The probe and brake control 18 is used to detect when a braking condition exists and to control handpiece 5 in accordance with the braking condition detected. The probe and brake control 18 comprises a detector circuit 201 that is used to determine when a braking condition exists; a latching circuit 231 to require positive action by the operator to reset the brake mechanism once a brake condition has been detected; and switch circuitry 261 to indicate when a user desires to operate the tool.

The detector circuit 201 connects to probe 175 through jack 22 when a conductor is to be monitored, and has an output 225 that is connected to the latching circuit 231. After a braking condition has been detected, brake latching circuit 231 requires brake detector circuit 201 to indicate a no brake condition and switch circuitry 261 to indicate a switch open condition in order to reset the braking signal.

Detector circuit 201, in the illustrated preferred embodiment includes precision resistors 209, 211, 213, and 215; current limiting resistor 210; comparator 206; and capacitors 217, 219, 221, and 223. Probe jack 22 is connected to ground through precision resistor 209 (e.g., 1KΩ), to +5 volts through precision resistor 211 (e.g., 23.7KΩ), and to a non-inverting input 207 of comparator 206 through current limiting resistor 210 (e.g., 10KΩ). Together, precision resistor 209 and precision resistor 211 act as a voltage divider network and provide a current-limited voltage of, for example, approximately 200 milliamps and 200 millivolts to non-inverting input 207 of comparator 206, as well as to jack 22 and probe 175.

An inverting input 208 of comparator 206 is connected to ground through precision resistor 213 (e.g., 4.99KΩ) and to +5 volts through precision resistor 215 (e.g., 237KΩ). Together, precision resistor 213 and precision resistor 215 form a second voltage divider network, which provides a voltage of approximately 100 millivolts to inverting input 208 of comparator 206. This sets the threshold of the comparator. A first capacitor 217 (e.g., 0.1 microfarad) and a second capacitor 219 (e.g., 0.1 microfarad) act as de-coupling capacitors for +5 volts and −5 volts, respectively. A capacitor 221 (e.g., 0.1 microfarad) is used to prevent stray capacitance in the probe 175 from producing a false brake condition. A 100 picofarad, 200 volt capacitor 223 is used as a de-coupling capacitor to eliminate noise between the non-inverting input 207 and the inverting input 208 of comparator 206. The output of comparator 206 provides a braking signal at detector output 225.

The detector output 225 of the probe brake detector circuit 201 is connected to brake latching input 233 of brake latching circuit 231. Brake latching circuit 231 is used to insure that a braking condition will not be released until brake detector circuit 201 indicates a no brake condition and switch circuitry 261 indicates a switch open condition, and thus, the output 283 of switch circuitry 261 is connected to the brake latching circuit 231. Brake latching circuit 231 is formed of resistors 235, 237, 239, 247, 257, and 259; capacitors 241, 243, and 249; comparator 251; and diode 245. The switch circuitry 261 is comprised of the handpiece switch 105; an optional foot pedal switch 265; resistors 269, 273, and 275; capacitors 271, 277, and 279; and NAND gate 281.

The operation of the probe brake detector circuit 201 will now be described. The detector output 225 of the probe brake detector circuit 201 will remain at a high level (at or near +5 volts) as long as the voltage provided to the non-inverting input 207 of comparator 206 is higher than the voltage provided to the inverting input 208 of comparator 206. During normal operation, the first voltage divider network formed from precision resistor 209 and precision resistor 211 will provide a voltage of approximately 200 millivolts to the non-inverting input 207 of comparator 206 The second voltage divider network formed from precision resistor 213 and precision resistor 215 will provide a voltage of approximately 100 millivolts to the inverting input 208 of comparator 206. Since the voltage at the non-inverting input 207 is higher than the voltage at the inverting input 208, the detector output 225 from comparator 206 will be high. When probe 175 is grounded, such as when the bit 150 of handpiece 5 comes into electrical contact with the trace or conductor C being monitored by the detector circuit, the voltage at the non-inverting input 207 of comparator 206 will drop to approximately 0 volts, while the voltage at the inverting input 208 will remain at approximately 100 millivolts. Since the voltage at the inverting input 208 is, now, larger than the voltage at the non-inverting input 207, the detector output 225 will drop to approximately −2.5 volts, indicating a braking condition.

Brake latching input 233 is connected to non-inverting input 255 of comparator 251 through resistor 237 (e.g, 470KΩ). Brake latching input is connected to the output of comparator 251 and to +5 volts through pull up resistor 257 (e.g., 47KΩ). The brake latching output is also connected through limiting resistor 259 (e.g., 470KΩ) to brake latching output 258. Brake latching output 258 provides a Brake signal. The non-inverting input 255 of comparator 251 is connected to ground through resistor 235 (e.g., 470KΩ) and to the inverting input 253 of comparator 251 through capacitor 243 (e.g., 33 picofarad). Inverting input 253 is connected to ground through a parallel combination of resistor 239 (e.g., 470KΩ) and capacitor 241 (e.g, 0.01 microfarad). Inverting input 253 of comparator 251 is connected to node 246 through diode 245, and the node 246 is connected to ground through resistor 247 (e.g., 470KΩ). Node 246 is also connected through, capacitor 249 (e.g., 0.1 microfarad) to switch output 283 of switch circuitry 261.

During normal operation, brake latching input 233 will remain positive. As a result of resistor 235 and resistor 237, this positive voltage potential will be present at non-inverting input 255 of comparator 251. Inverting input 253 of comparator 251 will be held at or near ground through resistor 239. Since the non-inverting input 255 of comparator 251 will be more positive than the inverting input 253 of comparator 251, the output of comparator 251 will be positive.

When a braking condition occurs, brake latching input 233 will have a negative potential of, e.g., approximately −2.5 volts. As a result of resistor 235 and resistor 237, this negative voltage potential will be present at non-inverting input 255 of comparator 251. Since the inverting input 253 of comparator 251 will be more positive then the non-inverting input 255 of comparator 251, the output of comparator 251 will be negative. The feedback path from the output of comparator 251 through resistor 237 to non-inverting input 255 will prevent the latch from releasing until a reset condition is achieved. When the hand tool bit 150 is removed, detector output 225 will become positive indicating a no brake condition. The output of comparator 251, however, is sufficiently negative to maintain a negative voltage potential at non-inverting input 255 of comparator 251.

In order to reset this latch condition, it is necessary for the voltage potential at inverting input 253 of comparator 251 to be less then the voltage potential at non-inverting input 255 of comparator 251. This is accomplished when handpiece switch 105 or optional foot pedal switch 265 is released to an open condition. During normal operation, handpiece switch 105 or optional foot pedal switch 265 will be closed, resulting in a voltage of approximately +5 volts on switch output 283. This will result in capacitor 249 receiving a charge such that the voltage drop across capacitor 249 from switch output 283 to node 246 is +5 volts. Diode 245 will be reverse biased, preventing the switch output 283 from interfering with the latching condition. When either handpiece switch 105 or optional foot pedal switch 265 is opened, the voltage on switch output 283 will quickly drop from approximately +5 volts to approximately ground. In order to resist an instantaneous voltage change across capacitor 249, node 246 will drop to approximately −5 volts, thus maintaining the 5 volt drop across capacitor 249 from switch output 283 to node 246. Diode 245 will now be forward biased, resulting in a potential of approximately −5 volts to be transferred to inverting input 253 of comparator 251. Since the non-inverting input 255 is more positive then the inverting input 253, the output of comparator 251 will be positive. This resets the latch circuitry until detector circuit 201 indicates that a braking condition again exists.

Handpiece switch 105 is connected at one pole to switch conductor 267 and at the other pole to ground. The optional foot pedal switch 265 is also connected at one pole to switch conductor 267 and at the other pole to ground. Switch conductor 267 is connected to ground through capacitor 271 (e.g., 0.1 microfarad) and resistor 273 (e.g., 10 Ω) in series. Capacitor 271 and resistor 273 are used to eliminate transients during the switching process. Switch conductor 267 is connected to +5 volts through pull up resistor 269 (e.g., 10 Ω). Switch conductor 267 is connected to a first input 285 of NAND gate 281 through current limiting resistor 275 (e.g., 1MΩ). First input 285 of NAND gate 281 is also connected to +5 volts through a noise elimination capacitor 277 (e.g., 0.1 microfarad). Second input 287 of NAND gate 281 is connected to +5 volts. As configured, NAND gate 281 acts as an invertor. The output of NAND gate 281 will be low when first input 285 is high and the output of NAND gate 281 will be high when first input 285 is low. NAND gate 281 is used to shape the pulses resulting from the switching circuitry. A de-coupling capacitor 279 (0.1 microfarad) is connected between +5 volts and ground.

When handpiece switch 105 is open (and also optional foot pedal switch 265, if provided), switch conductor 267 and second input 285 of NAND gate 281 will be held high through pull up resistor 269. As a result, the output of NAND gate 281 and switch output 283 will be low, indicating a switch open condition. If either handpiece switch 263 or optional floor pedal switch 265, or both, are closed, switch conductor 267 and second input 285 of NAND gate 281 will be pulled low. As a result, the output of NAND gate 281 and switch output 283 will be high, indicating a switch closed condition.

The switch output 283 from the switch circuitry 261 is connected to a first input 293 of NAND gate 291. A second input 295 of NAND gate 291 is connected to brake latching output 258 of the probe brake latch circuit 231. The output 299 from NAND gate 291 provides a Run signal. The Run output 299 of NAND gate 291 will be low, indicating a run condition, only when both first input 293 and second input 295 are high. This corresponds to a high condition on switch output 283 of switch circuitry 261 indicating that either, or both, of handpiece switch 263 and optional foot pedal switch 265 are closed and a high condition on brake latching output 258 of brake latch circuit 231. This situation means that a no brake (tool operating) condition exists. If either first input 293 or second input 295 to NAND gate 291 is low, indicating a switch open or brake condition respectively, the run output 299 of NAND gate 291 will be high. This situation means that a not run (tool braking) condition exists.

The probe and brake control 18 monitors conductor C of circuit board 160 to determine when a tool braking condition exists. If a braking condition exists, probe and brake control 18 sends a signal to torque and speed control 14 to stop the handpiece 5. If a braking condition exists, a signal is also sent to display indicator 16 to indicate to the operator that a braking condition exists.

Figure 9:
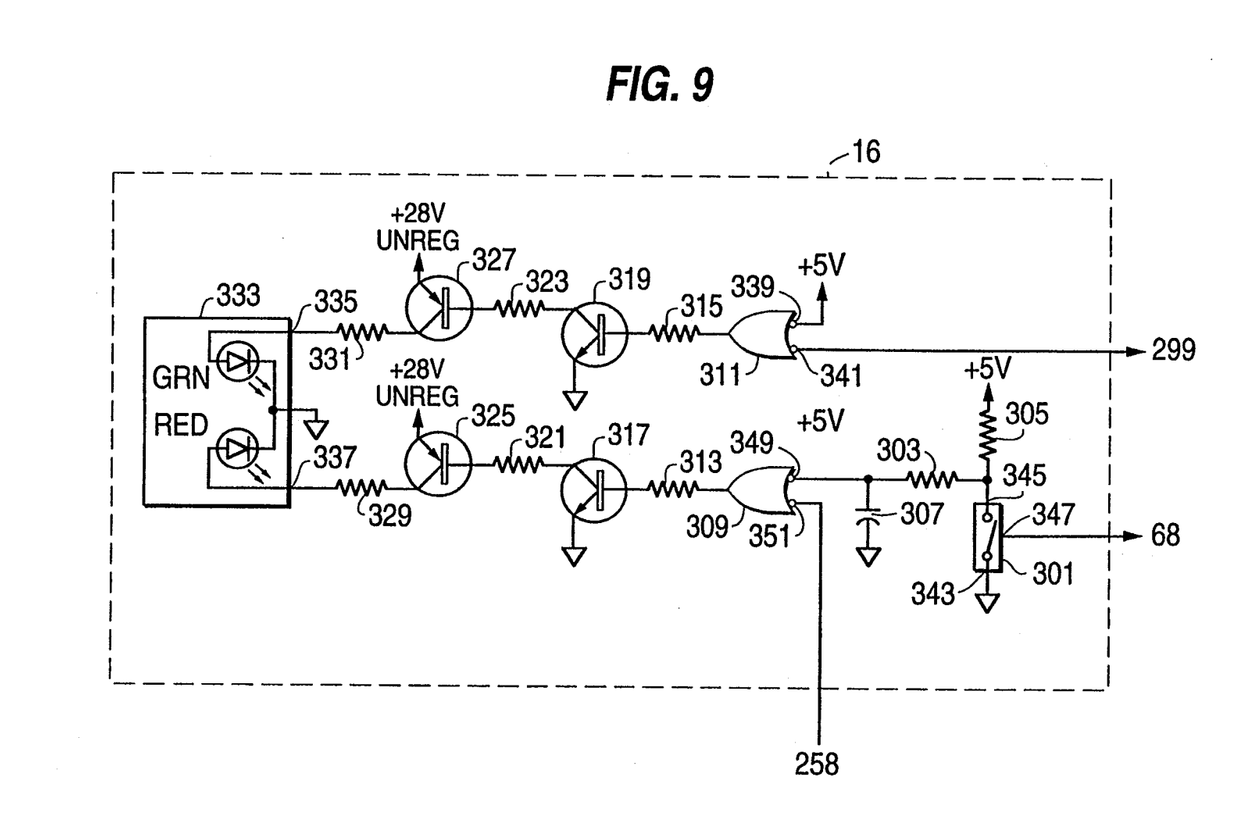
FIG. 9 is a circuit diagram of a display indicator of the present invention.

The display indicator 16 is shown in more detail in FIG. 9. The display indicator 16 will warn the operator when an over-torque or brake condition exists. Display indicator 16 is comprised of analog switch 301; resistors 303, 305, 313, 315, 321, 323, 329, and 331; capacitor 307; transistors 317, 319, 325, and 327; NAND gates 309 and 311; and red/green LED 333.

As shown in FIG. 9, a first input 339 of NAND gate 311 is connected to +5 volts and a second input 341 of NAND gate 311 is connected to the run output 299 of NAND gate 291 so as to receive the Run signal therefrom. The output of NAND gate 311 is connected through resistor 315 (e.g., 470KΩ) to the base of transistor 319. The emitter of transistor 319 is connected to ground. The collector of transistor 319 is connected through resistor 323 (e.g., 100KΩ) to the base of transistor 327. The emitter of transistor 327 is connected to +28 volts unregulated. The collector of transistor 327 is connected through resistor 331 (e.g., 2KΩ) to green input 335 of red/green LED 333. A first pole 343 of analog switch 301 is connected to ground and a second pole 345 of analog switch 301 is connected through pull up resistor 305 (e.g., 2.7MΩ). A control line 347 of analog switch 361 is connected to the over-torque signal 68. The second pole 345 of analog switch 301 is connected through resistor 303 (e.g., 47KΩ) to a first input 349 of NAND gate 309. The first input 349 of NAND gate 309 is also connected to ground through capacitor 307 (e.g., 0.1 microfarad). A second input 351 of NAND gate 309 is connected to the brake latching output 258 to receive the Brake signal. The output of NAND gate 309 is connected through 470KΩ resistor 313 to the base of transistor 317. The emitter of transistor 317 is connected to ground. The collector of transistor 317 is connected through 100KΩ resistor 321 to the base of transistor 325. The emitter of transistor 325 is connected to +28 volts unregulated. The collector of transistor 325 is connected through 2.7KΩ resistor 329 to red input 337 of red/green LED 333.

In operation, red/green LED 333 is capable of illuminating in one of three different colors; red, green, or orange. A green illumination indicates that the handpiece 5 is operating normally. A red illumination indicates that a brake condition is in effect. An orange illumination indicates that an over-torque condition exists. If green input 335 is positive and red input 337 is at ground, then red/green LED 333 will be green. If green input 335 is at ground and red input 337 is positive, then red/green LED 333 will be red. If green input 335 is positive and red input 337 is positive, then red/green LED 333 will be orange. If green input 335 is at ground and red input 337 is at ground, red/green LED 333 will be extinguished.

Since first input 339 of NAND gate 311 is connected to +5 volts, NAND gate 311 acts as an invertor. The output of NAND gate 311 will be high when the second input 341 is low. Similarly, the output of NAND gate 311 will be low when the second input 341 is high. Since second input 341 is connected to receive the Run signal from the output of NAND gate 291, NAND gate 311 will act as an invertor to produce a reversed signal (e.g., zero to one) that now constitutes the Run signal. If the output of NAND gate 311 is high, transistors 319 and 327 will be turned on resulting in a positive voltage at green input 335 of red/green LED 333. Similarly, if the output of NAND gate 311 is low, transistors 319 and 327 will be off and no voltage will be supplied to green input 335 of red/green LED 333.

When the overtorque signal 68 is low, analog switch 301 will remain open. As a result, second pole 345 of analog switch 301 will be pulled high by the connection through pull up resistor 305 to +5 volts. This will result in first input 349 of NAND gate 309 being high. In this condition, NAND gate 309 acts as a invertor. The output of NAND gate 309 will be high when the second input 351 is low. Similarly, the output of NAND gate 309 will be low when the second input 351 is high. Since second input 351 is connected to receive the Brake signal from brake latching output 258, the output of NAND gate 309, acting as an invertor, will produce a reversed signal which now constitutes the Brake signal. If the output of NAND gate 309 is high, transistors 317 and 325 will be turned on resulting in a positive voltage at red input 337 of red/green LED 333. Similarly, if the output of NAND gate 309 is low, transistors 317 and 325 will be off and no voltage will be supplied to red input 337 of red/green LED 333.

When the over-torque signal 68 is high, analog switch 301 will be closed. As a result, second pole 345 of analog switch 301 will be connected through analog switch 301 and first pole 343 to ground. This will result in first input 349 of NAND gate 309 being at ground. In this condition, the output of NAND gate 309 will be high irrespective of the second input 351. Since the output of NAND gate 309 is high, transistors 317 and 325 will be turned on resulting in a positive voltage at red input 337 of red/green LED 333.

Due to the circuitry shown in FIG. 8, it is not possible for the Brake and Run signals to both be low simultaneously. Allowing such a condition is inconsistent since anytime a Brake signal exists it is desired to stop the tool. From the above it can be seen that anytime a Brake signal exists, the red input 337 to red/green LED 333 will be positive and the green input 335 to red/green LED 333 will be at ground, resulting in a red illumination of red/green LED 333. Furthermore, if a Brake signal does not exist, a Run signal does exist, and an over-torque signal does not exist, the green input 335 of red/green LED 333 will be positive and the red input 337 of red/green LED 333 will be at ground, resulting in a green illumination of red/green LED 333. If a Brake signal does not exist, a Run signal does exist, and an over-torque signal does exist, both the green input 335 of red/green LED 333 and the red input 337 of red/green LED 333 will be positive, resulting in an orange illumination of red/green LED 333.

Thus, a simple and effective means for providing the user with a visual indication of the status of the machining tool can be provided, yet all of the possible conditions affecting the operating speed of the tool can be taken into account using a single speed status display element. This display element is shown on the housing of control unit 10 in FIG. 3.

From the foregoing it should now be apparent how the present invention serves to provide a handheld low voltage machining tool with which any one or more of drilling, milling, and abrading operations can be safely performed even on densely populated, multilayer, circuit boards in a manner which prevents electrical overstress by isolating the tip of the machining tool from the drive motor as well as abrupt starting of the tool which can cause jerking, jumping or skipping of the tool off of the target, and achieves dynamic braking of the tool, both upon release of an operator actuated control switch and due to a selected conductive layer being reached. However, while a specific embodiment has been shown and described, numerous other embodiments as well as modifications and variations of the described embodiment will be apparent to those skilled in the art. Likewise, the values of the resistors, capacitors, etc. should be considered merely as illustrative and are not themselves critical. As such, the present application should not be viewed as limited to the aspects shown and described herein, and to the contrary, the invention is intended to encompass the full scope of the appended claims.

We claim:

1. A handheld low voltage machining tool comprising a handpiece having securing means for rotatably securing one of a plurality of different machining tool bits in an exchangeable manner and an electric drive motor for rotating said securing means; an electrically conductive probe; and a control unit that is connectable to said probe for supplying power thereto, said control unit being connectable to said handpiece for controlling operation thereof; wherein said control unit includes brake means for stopping rotation of said tool bit, and brake control means for detecting when said probe and a machining tool bit secured in said holding means are brought into contact with a common electrically conductive path.

2. A handheld low voltage machining tool according to claim 1, wherein said securing means is grounded.

3. A handheld low voltage machining tool according to claim 2, wherein said securing means is conductively isolated from said drive motor, and said control means is operative for providing a voltage in a millivolt range to said probe.

4. A handheld low voltage machining tool according to claim 3, wherein said securing means is connected to a drive shaft extension which is rotatably connected to a drive shaft of said electric drive motor in a conductively isolated manner; wherein a filter choke is provided between said electric drive motor and a handpiece power cable by which the handpiece is connected, powered and controlled by said control unit; wherein said handpiece has switch means for actuation thereof which includes a first and second switch contacts, and wherein said power cable is comprised of six conductors in an annular circumferential sequence in which a ground wire is shielded from drive signal wires by unused wires; whereby transient voltage leakage from said electric drive motor to the tool bit in said securing means is minimized.

5. A handheld low voltage machining tool according to claim 4, wherein said ground wire is a first conductor which is connected to ground via said first switch contact, one of said unused wires is a second conductor located adjacent said first conductor, wherein said drive signal wires are a third conductor located adjacent said second conductor and a fourth conductor located adjacent said third conductor, is connected to said filter choke, and wherein another of said unused wires is a fifth conductor located adjacent said fourth conductor.

6. A handheld low voltage machining tool according to claim 4, wherein said drive shaft extension is formed of brass and is grounded to said second switch contact by grounding means comprising a copper and carbon alloy brush block which is spring-loaded into engagement with the drive shaft extension and is electrically conductively connected with said second switch contact.

7. A handheld low voltage machining tool according to claim 3, wherein said securing means is connected to a drive shaft extension which is rotatably connected to a drive shaft of said electric drive motor in a conductively isolated manner; wherein said handpiece has a housing formed of an electrically conductive plastic material; wherein said drive shaft extension is formed of brass and is grounded to said handpiece housing by grounding means comprising a copper and carbon alloy brush block which is spring-loaded into engagement with the drive shaft extension and is electrically conductively connected with said handpiece housing.

8. A handheld low voltage machining tool according to claim 1, wherein said securing means is connected to a drive shaft extension which is rotatably connected to a drive shaft of said electric drive motor in a conductively isolated manner; wherein said handpiece has a housing formed of an electrically conductive plastic material; wherein said drive shaft extension is formed of brass and is grounded to said handpiece housing by grounding means comprising a copper and carbon alloy brush block which is spring-loaded into engagement with the drive shaft extension and is electrically conductively connected with said handpiece housing.

9. A handheld low voltage machining tool according to claim 1, wherein said control unit comprises a speed control means for preventing an abrupt increase in the speed of a tool bit in said securing means upon starting of said electric drive motor, said control unit including power control circuitry for gently ramping up power to said electric drive motor when said electric drive motor is actuated.

10. A handheld low voltage machining tool according to claim 9, wherein said power control circuitry comprises a resistor and capacitor connected so as to impose an R/C time constraint on the speed of said drive motor, and means for discharging said capacitor whenever said drive motor is deactivated.

11. A handheld low voltage machining tool according to claim 1, wherein said control unit comprises torque control means for providing a closed loop control of the operation of said drive motor by which a speed set by an operator is maintained under varying load conditions within operating load limits of the drive motor and reduces the operating speed of the drive motor when said load limits are exceeded.

12. A handheld low voltage machining tool according to claim 11, wherein said drive motor is a permanent magnet DC motor; wherein the current draw of said DC motor is used as a measure of torque by said torque control means; and wherein back EMF generated by the DC motor is used by said torque control means as a measure of motor speed.

13. A method of controlling machining of a circuit board comprising the steps of:

connecting a handpiece, having securing means for rotatably securing one of a plurality of different machining tool bits in an exchangeable manner and an electric drive motor for rotating said securing means, to a control unit for controlling operation thereof;

connecting an electrically conductive probe to said control unit for supplying power thereto;

connecting an end of said probe to an electrically conductive path of said circuit board;

supplying power to said electrically conductive path via said probe while machining said circuit board by rotating a tool bit secured to said handpiece; and immediately stopping rotation of said tool bit in response brake control means of said control unit detecting the tool bit secured to said handpiece being brought into contact with said electrically conductive path.

14. A method of controlling machining of a circuit board according to claim 13, wherein said tool bit is grounded, and wherein said detecting of the tool bit secured to said handpiece being brought into contact with said electrically conductive path is performed by detecting grounding of the power supplied to said electrically conductive path via said probe.

15. A method of controlling machining of a circuit board according to claim 14, wherein the voltage supplied to said electrically conductive path via said probe during said supplying step is in a current-limited millivolt range; and transient voltage leakage to the tool bit from the electric drive motor is minimized by the steps of: connecting the securing means to a drive shaft extension which is rotatably connected to a drive shaft of said electric drive motor in a conductively isolated manner; providing a filter choke between said electric drive motor and a handpiece power cable by which the handpiece is connected, powered and controlled by said control unit; which includes a first and second switch contacts, and arranging conductors of said power cable in an annular circumferential sequence in which a ground wire is shielded from drive signal wires by unused wires.

16. A method of controlling machining of a circuit board according to claim 13, wherein the voltage supplied to said electrically conductive path via said probe during said supplying step is in a current-limited millivolt range; and transient voltage leakage to the tool bit from the electric drive motor is minimized by the steps of: connecting the securing means to a drive shaft extension which is rotatably connected to a drive shaft of said electric drive motor in a conductively isolated manner; providing a filter choke between said electric drive motor and a handpiece power cable by which the handpiece is connected, powered and controlled by said control unit; which includes a first and second switch contacts, and arranging conductors of said power cable in an annular circumferential sequence in which a ground wire is shielded from drive signal wires by unused wires.

17. A method of controlling machining of a circuit board according to claim 13, further comprising the step of providing a closed loop control of the operation of said drive motor by a torque control means of said control unit so as to maintain a speed set by an operator under varying load conditions within operating load limits of the drive motor and so as to reduce the operating speed of the drive motor when said load limits are exceeded.

18. A method of controlling machining of a circuit board according to claim 17, wherein said drive motor is a permanent magnet DC motor, and using the current draw of said DC motor as a measure of torque by said torque control means, and using back EMF generated by the DC motor as a measure of motor speed by said torque control means.

19. A method of controlling machining of a circuit board according to claim 13, further comprising the step of preventing an abrupt increase in the speed of a tool bit in said securing means upon starting of said drive motor by gently ramping up power to said drive motor when said drive motor is actuated.

20. A method of controlling machining of a circuit board according to claim 19, wherein the preventing step is performed by power control circuitry comprised of a resistor and capacitor connected so as to impose an R/C time constraint on the speed of said drive motor, and means for discharging said capacitor whenever said drive motor is deactivated.

* * * * *